United States Patent [19]

Mueller et al.

[11] Patent Number: 5,077,378

[45] Date of Patent: Dec. 31, 1991

[54] POLYAMIDE CONTAINING THE HEXAFLUOROISOPROPYLIDENE GROUP

[75] Inventors: Werner H. Mueller, Warwick; Dinesh N. Khanna, West Warwick; Bernd Hupfer, North Kingstown, all of R.I.

[73] Assignee: Hoechst Celanese Corporation, Somerville, N.J.

[21] Appl. No.: 526,583

[22] Filed: May 21, 1990

Related U.S. Application Data

[63] Continuation of Ser. No. 915,342, Oct. 2, 1986, abandoned.

[51] Int. Cl.$^5$ .............. C08G 63/00; C08G 69/26; G03C 1/52
[52] U.S. Cl. .............. 528/185; 528/183; 528/332; 528/335; 528/336; 528/338; 528/339; 430/192; 430/326
[58] Field of Search .............. 528/185, 183, 332, 335, 528/336, 338, 339

[56] References Cited

U.S. PATENT DOCUMENTS

| | | | |
|---|---|---|---|
| Re. 30,186 | 1/1980 | Rubner et al. | 430/325 |
| 3,328,352 | 6/1967 | Kwolek | 528/172 |
| 3,449,296 | 6/1969 | Angelo et al. | 528/185 |
| 3,666,473 | 5/1972 | Colom et al. | 96/91 D |
| 3,957,512 | 5/1976 | Kleeberg et al. | 96/35.1 |
| 4,045,223 | 8/1977 | Rubner et al. | 96/35.1 |
| 4,093,461 | 6/1978 | Loprest et al. | 96/36 |
| 4,111,906 | 9/1978 | Jones | 528/229 |
| 4,115,128 | 9/1978 | Kita | 96/91 D |
| 4,173,470 | 11/1979 | Fahrenholtz et al. | 430/5 |
| 4,173,472 | 11/1979 | Berwick et al. | 430/60 |
| 4,284,699 | 8/1981 | Berwick et al. | 430/58 |
| 4,339,521 | 7/1982 | Ahne et al. | 430/192 |
| 4,395,482 | 7/1983 | Ahne et al. | 430/326 |
| 4,622,285 | 11/1986 | Ahne | 430/322 |
| 4,645,823 | 2/1987 | Ai et al. | 528/21 |

FOREIGN PATENT DOCUMENTS

2188936 10/1987 United Kingdom .

OTHER PUBLICATIONS

Lau, K. S. Y. et al., *J. of Polym. Sci.*, vol. 20, pp. 2381-2391, 1982, J. Wiley & Sons.
Windholtz, M. Ed., *The Merck Index*, p. 432, 10th Ed., 1983, Merck & Co., Inc.

*Primary Examiner*—Richard L. Schilling
*Assistant Examiner*—Christopher G. Young
*Attorney, Agent, or Firm*—Perman & Green

[57] ABSTRACT

This invention is that of high temperature polyamides containing the hexafluoroisopropylidene group. The high temperature polyamides of the invention and photo or radiation sensitizers provide improved high temperature positive resists which can be developed in aqueous alkaline developer and thermally anneal to form heat resistant, polyoxazole relief structures suitable for use in microelectronic and printing applications. The positive photoresists of the invention have improved solubility in coating solvents and improved photospeed. The polyamides of the invention can be prepared by conventional condensation reactions; e.g. the condensation of a diamine and diacid chloride. In addition the polyamides of this invention provide high temperature protective coatings with superior adhesion properties in applications other than the photoresist area.

6 Claims, No Drawings

POLYAMIDE CONTAINING THE HEXAFLUOROISOPROPYLIDENE GROUP

This is a continuation of application Ser. No. 06,915,342 filed on Oct. 2, 1986, abandoned.

BACKGROUND OF THE INVENTION

This invention relates to polyamides containing the hexafluoroisopropylidene group

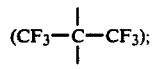

to protective coatings and to positive photosensitive and radiation sensitive, high temperature, photoresist compositions prepared therefrom and to a method of preparing heat resistant protective coatings and relief structures of such compositions.

Positive photoresist compositions and their use are well known. Generally such photoresists compositions are prepared from alkali-soluble, phenol-formaldehyde novolak resins and light or radiation sensitive o-quinone diazides or naphthoquinone diazides. Examples of such positive photoresists are described in U.S. Pat. Nos. 3,666,473; 4,115,128; and 4,173,470.

Conventional positive novolak resists have limited temperature dimensional stability and are not well suited for modern high temperature, processes, and applications. Heat resistant, negative resists are known in the art and disclosed in U.S. Pat. Nos. 3,957,512; 4,045,223; 4,088,489; Re 30,186 and DE 3411659A1. Also heat resistant positive resists are known and disclosed in U.S. Pat. Nos. 4,093,461; 4,339,521; and 4,395,482. The advantages of positive resists over negative resists are also known in the art which include higher resolution and exposure time stability in the presence of oxygen.

In the industrial application of positive resists, the polymeric component and the photosensitizer are dissolved in an organic solvent or mixture of solvents and applied as a thin film or coating to a substrate suitable for the desired application.

The polymeric component of these photoresist formulations is soluble in aqueous alkaline solutions, but the sensitizer acts as a dissolution rate inhibitor with respect to the polymer. Upon exposure of selected areas of the coated substrate to actinic radiation, the sensitizer undergoes a radiation induced structural transformation and the exposed areas of the coating are rendered more soluble than the unexposed areas. This difference in solubility rates causes the exposed areas of the photoresist coating to be dissolved when the substrate is immersed in alkaline developing solution leaving the unexposed areas substantially intact, thus producing a positive relief pattern on the substrate.

In most applications, the exposed and developed substrate will be subjected to treatment by a substrate-etchant solution. The photoresist coating protects the coated areas of the substrate from the etchant and thus the etchant is only able to etch the uncoated areas of the substrate, which in the case of a positive photoresist, corresponds to the areas that were exposed to actinic radiation. Thus, an etched pattern can be created on the substrate which corresponds to the pattern of the mask, stencil, template, etc., that was used to create selective exposure patterns on the coated substrate prior to development.

The relief pattern of photoresist on substrate produced by the method described above is useful for various applications including, for example, as an exposure mask or a pattern such as is employed in the manufacture of miniaturized integrated electronic components or the manufacture of a printing plate.

The properties of a photoresist composition which are important in commercial practice include the solubility of the resist in the application solvent, the photospeed of the resist, development contrast, resist resolution, resist adhesion, dimensional stability at elevated temperature and abrasion resistance.

Photospeed is important for a photoresist, particularly in applications where a number of exposures are needed, for example, in generating multiple patterns by a repeated process, or where light of reduced intensity is employed such as in projection exposure techniques where the light is passed through a series of lenses and mono-chromatic filters. Thus, high, controlled photospeed is particularly important for a resist composition employed in processes where a number of multiple exposures must be made to produce a mask or series of circuit patterns on a substrate. Control of the photospeed is extremely important in order to produce high resolution relief patterns in micro-circuitry—a photospeed too high can result in narrowing the processing conditions.

Resist resolution refers to the capability of a resist system to reproduce the smallest equally spaced line pairs and intervening spaces of a mask which is utilized during exposure with a high degree of image edge acuity in the developed exposed spaces. In many industrial applications, particularly in the manufacture of miniaturized electronic components, a photoresist is required to provide a high degree of resolution for very small line and space widths (on the order of a micron or so).

The ability of a resist to reproduce very small dimensions, on the order of a micron or so, is extremely important in the production of large scale integrated circuits on silicon chips and similar components. Circuit density on such a chip can be increased, assuming photolithography techniques are utilized, by increasing the resolution capabilities of the resist.

Various attempts have been made in the prior art to produce high temperature positive resists possessing the above desired properties. For example, U.S. Pat. No. 4,093,461 discloses a heat resistant, positive resist composition comprising a quinone or naphthoquinone diazide and the polycondensation product of an aromatic dianhydride and an aromatic diamine. The properties of the positive resist of the patent are discussed in U.S. Pat. No. 4,395,482 (column 1, lines 46-64). There it is pointed out that the positive resist composition of U.S. Pat. No. 4,093,461 has limited storage life, insufficient stability to alkaline etching solutions and relatively small differences in solubility between the exposed and unexposed portion of the resist.

U.S. Pat. No. 4,395,482 and U.S. Pat. No. 4,339,521 disclose positive resist compositions containing oligomer and/or polymeric precursors of polyoxazoles in the form of a polycondensation products of aromatic and-/or heterocyclic dihydroxydiamino compounds and dicarboxylic acid chlorides or esters. These references specifically disclose a poly(benzidine isophthal-amide). These positive resist compositions are said to have long storage life, high heat resistance, good processability and suitability of applications in microelectronics; i.e., the preparation of finely structured patterns. They however have several disadvantages which include low solubility in the commonly used solvents and low photospeed relative to the resists of this invention.

The present invention provides an improved high temperature positive photoresist composition with improved photospeed, improved solubility in the typical organic solvents used in the preparation of photoresist and improved adhesion properties while at the same time they have good long term storage stability, in the dry and solution form, and high resolution. Additional advantages of the photoresists of this invention are higher transparency and low toxicity (the benzidine of Example 1 of U.S. Pat. No. 4,395,482 is listed as a carcinogen and it is difficult to prepare). It has been noted that the poly(benzidine isophthalamide) of the '482 patent is not gel free when prepared and; it must be filtered prior to isolation from the reaction solvent. Also a photoresist solution of this poly(benzidine isophthalamide) forms gels upon standing which is indicative of storage instability of the resist solution.

SUMMARY OF THE INVENTION

This invention is that of a novel polyamide typically prepared by the condensation of hexafluoro-2,2-bis(3-amino-4-hydroxyphenyl) propane with a dibasic acid chloride and mixtures of dibasic acid chlorides. A portion of the hexafluoro-2,2-bis(3-amino-4-hydroxyphenyl) propane may be replaced with another diamine comonomer optionally containing less hydroxy substituents in order to reduce the solubility of the polymer in alkaline aqueous photoresist developer and increase the polymer solubility in solvent. Alternately, the developer solubility of the polyamide can be reduced or its solvent solubility increased by neutralizing the solubilizing effect of the hydroxy groups in the preformed polymer by converting them to a less developer soluble moiety; for example, by acylating a portion of the hydroxy groups in the preformed polymer. The use of non-hydroxy comonomers or post-polymerization neutralization of the hydroxy groups provides another method of controlling the resist's photospeed.

The invention also is that of a positive high temperature photoresist composition comprising the above described polyamide and o-quinone and/or o-naphthoquinone diazide photosensitizer or radiation sensitizer.

It has also been found that the solvent solubility and photospeed of the resists of this invention may be controlled by employing a mixture of dibasic acid chlorides in the preparation of the polyamide component of the resist and/or a mixture of hexafluoro-2,2-bis(3-amino-4-hydroxyphenyl)-propane and another diamine. Particularly preferred dibasic acid chlorides useful for this purpose are isophthaloyl chloride and hexafluoro-2,2-bis(4-chlorocarbonylphenyl)-propane. Isophthaloyl chloride when polymerized with hexafluoro-2,2-bis(3-amino-4-hydroxyphenyl -propane produces a polyamide which when employed in a positive photoresist composition gives a resist having an extremely high photospeed. Preferably, the isophthaloyl chloride is used in admixture with another dibasic acid chloride and polymerized with hexafluoro-2,2-bis-(3-amino-4-hydroxyphenyl)-propane. Preferred dibasic acid chloride admixtures are 30 to 70 mole percent of isophthaloyl dichloride with 70 to 30 percent terephthaloyl chloride or hexafluoro-2,2-bis-(4-chlorocarbonyl-phenyl)-propane; preferably 50 mole percent isophthaloyl chloride; said molar percentages being based upon the dibasic acid chloride content of the mixture.

This invention, therefore, provides a method for making a positive photoresist composition of predetermined solvent solubility and photospeed. The photosensitivity of the resists of the invention can be controlled, for example, from about 10 $mJ/cm^2$ to about 300. This result is achieved by controlling the polyamide component's composition. Surprisingly, the hexafluoroisopropylidene group when used as a linking group in the diamine component of the polyamide provides increased photospeed and solvent solubility while in the dibasic acid chloride it reduces the photospeed and increases solvent solubility.

This positive resist after coating and exposure in the conventional manner can be developed in alkaline aqueous photoresist developer to provide fine structured relief structures suitable for use in microelectronic and printing applications and the photospeed of the resist can be controlled to suit the particular application at hand. The photoresist has high thermal stability (250°–350° C.), improved photospeed, improved solubility in the commonly used coating solvents and superior adhesion.

The invention also relates to a method of improving the heat resistance of such fine structured relief patterns by thermally curing the developed photoresist to convert the polyamide into a polybenzoxazole which is thermally stable at temperatures up to 550° C.

The polyamides of the invention also are useful in producing high-heat, protective coatings per se because of their increased solubility in commonly used solvents, superior adhesion and superior heat resistance.

DETAILED DESCRIPTION OF THE PREFERRED EMBODIMENTS

This invention is that of a high temperature polyamide containing the hexafluoroisopropylidene group. These polyamide have the following general formula (1):

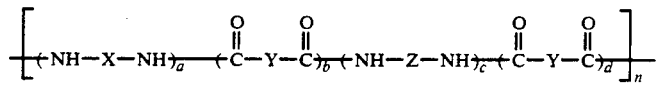

where:

X is the divalent group:

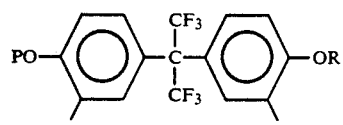

a = 0.10 to 0.50 mole fraction
b = 0.25 to 0.50 mole fraction
c = 0.00 to 0.40 mole fraction
d = 0.00 to 0.25 mole fraction where:

a+b+c+d=1, said mole fractions being based upon the total moles of X+Y+Z in the polymer.

where:
n is an integer from about 2–500; preferably 20–300 and for photoresist application most preferably about 5–200 wherein R is independently selected from hydrogen and a substituted or unsubstituted aliphatic or aromatic monovalent group having up to nine carbons; preferably, R is selected from hydrogen, methyl, ethyl and phenyl.

The groups Y and Z are unsubstituted or a substituted aliphatic, aromatic or alicyclic divalent group having up to 60 carbons and mixtures thereof.

The divalent group Y is independently selected from methylene and difluoromethylene and both the divalent groups Y and Z are independently selected from polydifluoromethylene of 2 to 12 carbons; a substituted or unsubstituted polymethylene of 2 to 12 carbons; cyclohexylene; cyclohexenylene; piperazinylene; arylene; biarylene; napthalenylene; and polyarylene wherein the linking group (hereinafter W) between the arylene rings is independently selected from a single carbon to carbon bond; methylene; polymethylene of 2 to 12 carbons; difluoromethylene, polydifluoromethylene from 2 to 12 carbons; hexafluoroisopropylidene; isopropylidene; oxy; thio; sulfinyl; sulfonyl; sulfonyldioxy; sulfonamido; carbonyl;

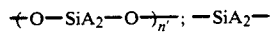
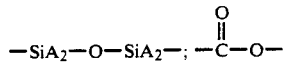
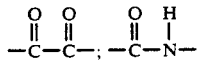
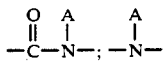
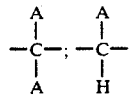
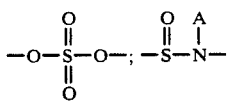
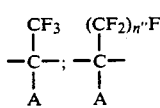
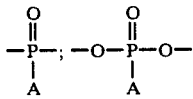
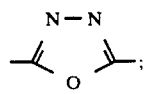
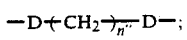
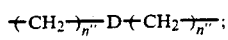

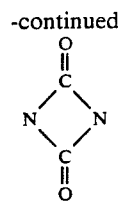

cyclohexylene; cyclohexenylene; napththalenylene and mixtures thereof.

The substituent A is independently selected from substituted or unsubstituted: alkyl of 1 to 8 carbons, phenyl and naphthyl.

The group D is independently selected from: oxy, thio, carbonyl, oxycarbonyl, sulfonamido, sulfinyl, sulfonyl, sulfonyldioxy, benzenedicarbonyl, benzenedioxycarbonyl

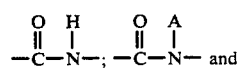
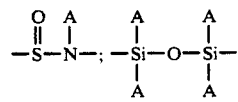

The integer n' is 1 to 25.
The integer n" is 1 to 12.

The terms aromatic and alicyclic as used herein include hetero-aromatics and hetero-alicyclics wherein one or more of the carbon atoms have been replaced with —O—, —S—, or —N— atoms.

The term polyarylene is used herein to describe the divalent group having the formula:

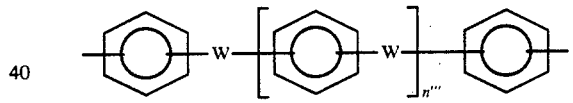

wherein W is the linking groups identified above and it is independently selected. The integer n''' is 0, 1, 2 or 3 with the proviso that when n''' is zero than W is not a carbon to carbon bond.

The hydrogen atoms of the divalent group Y may be substituted with compatible substituents. Exemplary substituents include chloro, bromo, fluoro, alkyl from 1 to 6 carbons, perfluoroalkyl from 1 to 6 carbons, substituted or unsubstituted aryl of 6 to 12 carbons, alkyl or aryl carboxylic esters of 2 to 9 carbons, alkoxy of 1 to 6 carbons, aryloxy of 6 to 10 carbons, acylamino of 1 to 6 carbons, substituted or unsubstituted alkylaryl of 7 to 12 carbons and substituted or unsubstituted arylalkyl of 7 to 12 carbons.

The hydrogen atoms of the divalent group Z may also be substituted with compatible substituents. Exemplary substituents include hydroxy, chloro, bromo, fluoro, alkyl from 1 to 6 carbons, perfluoroalkyl from 1 to 6 carbons, substituted or unsubstituted aryl of 6 to 12 carbons, alkyl or aryl carboxylic esters of 2 to 9 carbons, alkoxy of 1 to 6 carbons, aryloxy of 6 to 10 carbons, acylamino of 1 to 6 carbons, substituted or unsubstituted alkylaryl of 7 to 12 carbons and substituted or unsubstituted arylalkyl of 7 to 12.

Preferably, Y is at least 70 mole percent of an aromatic divalent group. More preferably, Y is selected from phenylene and hexafluoro-2,2-bis(phenyl)-propane and mixtures thereof. Most preferably Y is mixture of meta-phenylene, para-phenylene and hexafluoro-2,2-bis(para-phenyl)-propane comprising about 20-100 mole percent of the meta-phenylene group, more preferably about 30-70 mole percent, most preferably about 40-60 mole percent of the meta-phenylene group. Particularly preferred mixtures of the divalent group Y are:
1. an equal molar mixture of meta-phenylene and paraphenylene;
2. an equal molar mixture of meta-phenylene and hexafluoro-2,2-bis(para-phenyl)-propane;
3. a mixture of 50 mole percent meta-phenylene, 25 mole percent para-phenylene and 25 mole percent of hexafluoro-2,2-bis(p-phenyl)-propane.
4. a equal molar mixture of meta-phenylene and paraphenylene and hexafluoro-2,2-bis(para-phenyl)-propane.

The above molar percentages being based up the total moles of the group Y in the polymer.

Preferably Z is at least 70 mole percent of an aromatic divalent group and more preferably Z is:

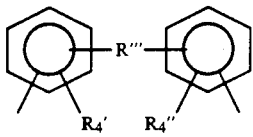

wherein R' and R" are independently selected from hydrogen, hydroxy, lower alkyl of 1 to 6 carbons, lower alkoxy of 1 to 6 carbons, aryloxy of 6 to 10 carbons, chloro, fluoro, nitro, and carboxylic aliphatic or aromatic ester having up to 10 carbons; with the proviso that when R''' is the hexafluoroisopropylidene group, R' and R" are not both hydroxy.

wherein R''' is independently selected from a carbon to carbon bond, methylene, a polymethylene having from 2 to 16 carbons, isopropylidene, difluoromethylene, a polydifluoromethylene having 2 to 12 carbons, sulfonyl, sulfinyl, sulfur, oxygen, carbonyl, oxycarbonyl, hexafluoroisopropylidene benzenedicarbonyl and benzenedioxycarbonyl.

Most preferably Z is:

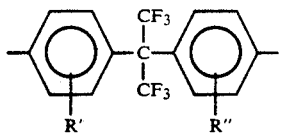

Since the preparation of the polyamides of this invention can be conducted by a random polymerization procedure, it is apparent that the general formula (1) is intended to represent the average molecular configuration of the polyamides of this invention and that the divalent group Z cannot be methylene or difluoromethylene.

The polyamides of the invention can be prepared by the condensation of approximately equal molar quantitites of hexafluoro-2,2-bis(3-amino-4-hydroxyphenyl)-propane and a dibasic acid chloride, preferably a mixture of such acid chlorides. Optionally, up to about 80 mole percent preferably up to about 50 mole percent and more preferably about 30 mole percent of the above hexfluoro-2,2-bis(3-amino-4-hydroxyphenyl)-propane monomer may be replaced with another diamino comonomer; optionally containing less hydroxy substituents in order to control the photospeed of positive resist compositions containing the polyamide. Examples of such comonomers which may be used are m-phenylene diamine; p-phenylene diamine; 4,4' diaminodiphenyl ether; 3,3'-diaminodiphenyl ether; 3,4'-diaminodiphenyl ether; 1,3-bis-(aminophenoxy)benzene (m-APB); 1,4-bis(aminophenoxy)-benzene (p-APB); benzidine; 3,3'-dimethoxy benzidine; 3,3'-dimethyl benzidine; 3,3'-dihydroxy benzidine; 3,3'-diaminodiphenyl methane; 4,4'-diaminodiphenyl methane; 4,4'-diaminodiphenyl propane; 3,3'-diaminodiphenyl sulfone; 4,4'-diaminodiphenyl sulfone; 4,4'-diaminodiphenyl sulfide; 3,3'-dihydroxy-4,4'-diaminodiphenyl sulfone; bis-(3-hydroxy-4-aminophenyl)-methane; 3,3'-dihydroxy-4,4'-diaminobenzophenone;α,α-bis(aminophenyl)p-diisopropylbenzene; 1,3-bis[4(4-aminophenoxy)-α,α-bistrifluoromethyl]benzene; 2,2-bis[4-(4-aminophenoxy)-phenyl]-hexafluoropropane; hexafluoro-2,2-bis-(3-amino-4-methylhexafluoro-2,2-bis-(4-aminophenyl)propane; hexafluoro-2,2-bis-(3-aminophenyl)propane; 1-2-bis(3-aminopropoxy)ethane; m-xylylenediamine; p-xylylenediamine; bis-(4-aminocyclohexyl)-methane; hexamethylenediamine; octamethylene diamine; decamethylene diamine; dodecamethylene diamine; 1,4-cyclohexane diamine; bis(3-aminopropyl)sulfide; N-methyl-bis(3-aminopropyl)amine; 4,4'-bis(p-aminophenoxy)diphenyl sulfide; 4,4'-bis (3"-aminophenoxy)-diphenyl sulfide; 4,4'(3"-aminophenoxy-(4'-aminophenoxy)-diphenyl sulfide; 4,4'-bis(p-aminophenoxy)-diphenyl sulfone; 4,4'-bis-(3"-aminophenyl sulfone; 2,2-bis-[4'-p-amino-phenoxy)phenyl]propane; 2,2-bis-[3'p-aminophenoxy)phenyl]-propane; 1,1-bis-[4'(p-aminophenoxy)phenyl]ethylbenzene and mixtures thereof.

Alternately, the polyamide can be modified after polymerization for example, by acylating a portion of the hydroxyl groups in the preformed polymer with a carboxylic aliphatic or aromatic acylating agent having up to 10 carbons such as acetic anhydride, propanoic anhydride, benzoyl chloride, and diketene.

The diamino and dibasic acid chloride monomers useful in the preparation of the polyamides of this invention can be prepared by known methods; see, for example, *Synthesis of Polymer Intermediates Containing the Hexafluoroisopropylidene Group*, Lau, K.S.; Landis, A.L.; Kelleghan, W.J. and Beard, C.D.; J. Polym. Sci; Vol. 20, page 2381-2391 (1982) which is incorporated herein by reference.

The polyamides of the invention are prepared by known polymerization methods; typically by the condensation of a diamine and acid chloride; see, for example, *Preparation of Fully Aromatic Polybenzoxazoles*, Kubota, T.; Nakanishiu, R.; Polymer Letters, Vol. 2, 655-659 (1964) which is incorporated herein by reference.

The polyamides of this invention are prepared from hexa-fluoro-2,2-bis(3-amino-4-hydroxyphenyl)propane or its reactive equivalent for e.g. hexafluoro-2,2-bis(3-amino-4-methoxyphenyl)-propane wherein the hydroxy group may be replaced by an alkoxy or aryloxy containing up to ten carbon atoms for example, ethoxy, propoxy, hutoxy, phenoxy etc. This diamine is used in an amount of from about 20 to 100 mole percent, preferably about 50 mole percent and most preferably about 70 to 100 mole percent of the diamine components present in the polymer.

Typical acid chlorides useful in the preparation of the polyamides of the invention are the acid chlorides of isophthalic acid; terephthalic acid; 4,4'-hexafluoro isopropylidene dibenzoic acid; 1,4-cyclohexane dicarboxylic acid; pentanedioic acid; hexanedioic acid; phthalic acid; 2,4-furandicarboxylic acid; 1,4-phenylene- diethanoic acid; 4,4'-biphenyl dicarboxylic acid; 1,1-bis(4-carboxyphenyl)-1-phenyl-2,2,2-trifluoroethane;, 4,4'-dicarboxy diphenyl ether; bis-(4-carboxyphenyl)-methyl phosphane oxide; 4,4'-dicarboxyltetraphenylsilane; bis(4-carboxyphenol)-sulfone; 5-tertiary butyl isophthalic acid; 5-bromoisophthalic acid; 5-fluoro-isophthalic acid; 5-chloroisophthalic acid; 2,2-bis-(p-carboxyphenyl)propane, 4,4'(p-phenylenedioxy) dibenzoic acid, 2,6-naphthalene dicarboxylic acid and mixtures thereof.

The polyamides of the present invention are useful in the preparation of positive photoresist compositions. These resist compositions comprise a polyamide as heretofore described and a radiation or light sensitizer. The polyamide and sensitizer are dissolved in a suitable solvent and applied to the desired substrate. The procedures for the preparation of resist are well known.

Similarly, the use of o-quinone diazides is well known to the skilled artisan as demonstrated by *Light Sensitive Systems*, Kosar, J.: John Wiley & Sons, New York, 1965 in Chapter 7.4 which is also incorporated herein by reference. These sensitizers which comprise a component of the resist compositions of the present invention are selected from the group of substituted naphthoquinone diazide sensitizers which are conventionally used in the art in positive photoresist formulations. Such sensitizing compounds are disclosed, for example, in U.S. Pat. Nos. 2,797,213; 3,106,465; 3,148,983; 3,130,047; 3,201,329; 3,785,825; and 3,802,885. Useful photosensitizers include naphthoquinone-(1,2)-diazide-5-sulfonyl chloride, and napththoquinone-(1,2)-diazide-4-sulfonyl chloride condensed with phenolic compounds such as hydroxy benzophenones.

Additives such as colorants, dyes, anti-striation agents, plasticizers, adhesion promoters, speed enhancers, solvents and such surfactants as non-ionic surfactants may be added to the solution of polyamide, sensitizer and solvent before the solution is coated onto a substrate.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. 44045) and Neutral Red (C.I. No. 50040) at one to ten percent weight based on the combined weight of polyamide and sensitizer. The dye additives help provide increased resolution by inhibiting back scattering of light off the substrate.

Anti-striation agents may be used up to five percent weight level, based on the combined weight of polyamide and sensitizer.

Adhesion promoters which may be used include, for example, beta-(3,4-epoxy-cyclohexyl)-ethyltrimethoxysilane; p-methyl-disilane-methyl methacrylate; vinyltrichlorosilane; and y-amino-propyl triethoxysilane up to a 4 percent weight level, based on the combined weight of polyamide and sensitizer.

Speed enhancers that may be used include, for example, picric acid, nicotinic acid or nitrocinnamic acid at a weight level of up to 20 percent, based on the combined weight of polyamide and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

Typical commercial solvents employed in the art may be used preparing the resist compositions of this invention. The amount of solvent used in the preparation of the resist solution may range up to about 95% by weight of the solution. The polyamides of the prior art have limited solubility in N-methylpyrrolidone and dimethylacetamide whereas the polyamides of the present invention have enhanced solubility in those solvents and additional solvent acceptable for commercial use. Typical useful solvents are N-methylpyrrolidone, dimethylacetamide, propylene glycol methyl ether, methylethyl ketone, cyclohexanone, butyrolactone and mixtures thereof; preferred solvents are N-methylpyrrolidone and propylene glycol methyl ether.

The prepared resist solution, can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. Suitable substrates include silicon, aluminum or polymeric resins, silicon dioxide, doped silicon dioxide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide substrate can be used as well. The substrate may also comprise various polymeric resins especially transparent polymers such as polyesters.

Suitable developing solutions for the radiation sensitive composition of the present invention are aqueous solutions of inorganic alkaline compounds such as those of sodium silicate, potassium silicate, sodium hydroxide, potassium hydroxide, lithium hydroxide, sodium phosphate, sodium monohydrogen phosphate, ammonium phosphate, ammonium monohydrogen phosphate, sodium metasilicate, sodium bicarbonate, ammonia, etc., with a suitable concentration of these compounds being between about 0.1 about 10, more preferably between 0.5 and 5%, by weight. Specific examples of developer solutions are disclosed in U.S. Pat. Nos. 3,110,596; 3,173,788; 3,586,504; etc.

Such an alkaline solution can also contain certain organic solvents such as alcohols (e.g., methanol, ethanol, benzyl alcohol, etc.) as well as a surface active agent (e.g., sodium alkylnaphthalene sulfonate, sodium lauryl sulfate, etc.) depending on the requirements.

After the resist composition solution is coated onto the substrate, the substrate is baked at approximately 80° to 105° C., preferably at about 90° C. until substantially all the solvent has evaporated and only a thin coating of photoresist composition on the order of a micron in thickness remains on the substrate. The coated substrate can then be exposed to actinic radiation in any desired exposure pattern, produced by use of suitable masks, negatives, stencils, templates, etc.

The exposed resist-coated substrates are next substantially immersed in alkaline developing solution. The solution is preferably agitated, for example, by nitrogen burst agitation.

The substrates are allowed to remain in the developer until all, or substantially all, of the resist coating has dissolved from the exposed areas.

After removal of the coated wafers from the developing solution, a post-development heat treatment or bake may be employed to increase the coating's adhesion and chemical resistance to etching solutions and other substances. In fact, the resist formulations of the present invention has excellent adhesion to substrates such as silicon wafers, aluminum plates, glass, polyester films etc. No adhesion promotor was necessary for the photoresist processing. The post-development heat treatment can comprise the oven baking of the coating and substrate below the coating's softening point; at a temperature from about 80°-375° C., preferably at 225°-350° C. The heat treatment time ranging from 0.5 to about 2.0 hours. Typically, the glass transition temperature (Tg) of the polyamide prior to heat treatment is in the order of about 250° C.-300° C. and after heat treatment and conversion to a polyoxazole structure about 300°-350° C., typically about 305° C.-325° C.

After curing the developed substrate may be treated with a buffered hydrofluoric acid or alkaline etching solution. The resist composition of the invention are resistant to both acid and base etching solutions and provide effective protection for the unexposed - resist-coated areas of the substrate. The developed, cured photoresist provides relief structures of excellent resolution and high thermal stability.

Although the above description is in terms of a wet-etching process, the relief patterns of the invention may be used in both wet and dry etching processes. The resulting structures are particularly useful insulating layers in microcircuitry applications, as masks in vapor depositions processes, ion implantation processes etc. Similarly, the photoresists of this invention may be used in the preparation of printing plates, lithographic proofing applications, lithographic transfer foils and other similar applications. The preparation of printing plates using positive photoresists is well known in the art; see e.g. U.S. Pat. No. 3,493,371; the teachings of which are incorporated by reference. They may be used as general protective coatings in numerous other applications readily apparent to one skilled in the art; e.g. the high solubility of the polyamides of the present invention make them particularly suited for high temperature protective coatings per se as well as in photoresist applications. In a typical coating application, a coating composition comprising about 5-30 weight percent of the polyamide of the invention in solution is applied to a substrate. Antioxidants, U.V. stabilizers, adhesion promoters, colorants, flame retardants, fillers and other auxillary agents up to about 20 weight percent may be optionally employed in the coating composition. The solvent is removed at a suitable temperature generally about 90°-150° C. and a reduced pressure may be employed to facilitate the solvent removal. After removal of the solvent, the polyamide coated substrate is heated to about 200°-350° C. for about 0.5-6.0 hours and the polyamide is converted into a polyoxazole of high heat resistance.

The following specific examples will provide detailed illustrations of the methods of producing and utilizing compositions of the present invention. These examples are not intended, however, to limit or restrict the scope of the invention in any way and should be construed as providing conditions, parameters of values which must be utilized exclusively in order to practice the present invention. In the following examples the term Dark Film Erosion Rate is abbreviated to Erosion Rate.

EXAMPLE 1

The polyamide of the following formula was synthesized by the solution polycondensation method:

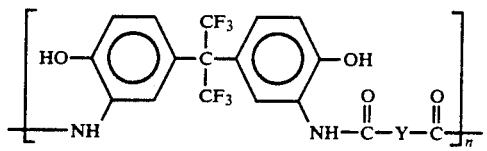

where Y=50/50 equal molar mixture of isophthaloyl/-terephthaloyl radicals and n was approximately 200.

To a solution of hexafluoro-2,2-bis(3-amino-4-hydroxy-phenyl)propane (0.01 mole=3.66 gm) in dimethyl acetamide (16.5 ml) and pyridine (3 ml) was added a 50/50 mixture of isophthaloyl chloride and terephthaloyl chloride (0.0055 moles isophthaloyl chloride=1.1165 gm) and (0.0055 moles terephthaloyl=1.1165 gm) in cyclohexanone (6.5 ml) dropwise with rapid stirring at −10° to −15° C. for 30 min. After stirring over night (24 hrs) at room temperature, the resulting solution was poured into an ice water mixture to precipitate the polymer. The polyamide was filtered, washed with water, and dried under vacuum at 90° overnight.

The yield was almost quantitative and inherent viscosity of the polymer was 0.40 dlg$^{-1}$ in dimethyl acetamide (0.5% conc. 25° C.).

EXAMPLE 2

A photoresist solution was prepared by dissolving 10 parts of polybenzoxazole precursor of Example 1 and 5 parts by weight of photosensitizer (mixed tris ester of trihydroxybenzophenone) and 0.08 parts by weight of red dye in 12 parts by weight of methylethyl ketone and 8.0 parts by weight of propylene glycol methyl ether. The solution was filtered and then roller coated on an anodized aluminum plate. After drying for 3 minutes at 90° C., a resist film having thickness of 2-3 um was obtained. This film was covered with a photomask having a stripped pattern so that the film and the photomask were in tight contact. Then UV light was irradiated thereon for 60 seconds by the use of mercury vapor lamp of 200 W. The intensity of the UV light at the film surface was 5 mw/cm$^2$ at a wavelength of 365 nm. After the irradiation, the coating was developed using 1:5 alkaline developer (AZ Developer):water mixture. The developed plate was washed with water to obtain a fine, uniform relief pattern having a minimum line width of 3 um. The developed plate was then given a post-development heat treatment at 250° C. for 1 hour.

The pattern obtained showed no blurring or loss of resolution after heating for up to 6 hours at a temperature of 250° C. Further, microcracks were not observed in the pattern after development or thermal treatment although some film thickness reduction was noticed after the heat treatment.

EXAMPLE 3

A photoresist solution was prepared by dissolving 10 parts of polybenzoxazole precursor, the polycondensation product of hexafluoro-2,2-bis(3-amino-4-hydroxyphenyl)propane and terephthaloyl dichloride which was prepared in accordance with the general procedure of Example 1, and 5 parts by weight of photosensitizer (mixed tris ester of trihydroxybenzophenone) and 0.08 parts by weight of a red dye (disperse red 179) in 12 parts by weight of methyl ethyl ketone and 8.0 parts by weight of propylene glycol methyl ether. The formulation was then filtered and roller coated on an anodized aluminum plate. The coated plate was dried at 90° C. for 3 minutes to obtain a resist film having thickness of 2–3um. The film was then covered with a photomask having a stripped pattern so that the film and the photomask were in tight contact. Then UV light was irradiated thereon for 60 seconds using a mercury vapor lamp of 200w. The intensity of the UV light at the film surface was 5 mw/cm$^2$ at a wavelength of 365. After the irradiation, the photoresist was developed using a 1:5 AZ alkaline developer:water solution and rinsed with water to obtain a relief pattern having a minimum line width of 2 um. The developed plate was then given a post heat treatment at 250° C. for 1 hour.

The pattern obtained showed no blurring or loss of resolution after heating for up to 6 hours at a temperature of 250° C. Further, microcracks were not observed in the pattern after development or thermal treatment.

EXAMPLE 4

The following example illustrates the acetylation of the hydroxyl groups in a preformed polyamide of the invention (the condensation products of hexafluoro-2,2-bis(3-amino-4-hydroxyphenyl)propane and a 50/50 mixture of isophthaloyl and terephthaloyl chloride. The polyamide copolymer, 4.96 gm (0.01 mole) was dissolved in 25 ml of dimethyl acetamide in a 100 ml, three-neck flask equipped with a stirrer, condenser, and thermometer, and heated to 100° C. under agitation. Then 0.2 gm of acetic anhydride was added and the reaction mixture was heated at 100° C. for 7 hours. The reaction mixture was drowned into ice water. The polymer obtained was a white fibrous solid. It was washed with water and dried in a vacuum oven at 100° C. overnight. Approximately 20% of the polymer's hydroxyl groups were esterified.

The following table illustrates the improved solubility of the polyamide precursors of this invention. The data is quantitative. Polymer A is a condensation product of hexafluoro-2,2-bis-(3-amino-4-hydroxyphenyl)-propane with 50/50 molar mixture of isophthaloyl chloride and terephthaloyl chloride. Polymer B is the condensation product of 3,3'-dihydroxy-benzidine and isophthaloyl chloride. Polymer A was prepared in accordance with the procedure of Example 1. Polymer B was prepared in accordance with the polymerization procedure of Example 1 of U.S. Pat. No. 4,395,482.

TABLE 1

| Solvent | Solubility - weight percent | |
|---|---|---|
| | Polymer A | Polymer B |
| N-methylpyrrolidone | 30 | <20* |
| Dimethylacetamide | 30 | <20* |
| Propylene glycol methyl ether | 30 | insoluble |

TABLE 1-continued

| Solvent | Solubility - weight percent | |
|---|---|---|
| | Polymer A | Polymer B |
| Methylethyl ketone | 20 | " |
| Cyclohexanone | 20 | " |
| Butyrolactone | 20 | " |

*not completely dissolved, gels present

The following comparative examples were prepared in order to illustrate the improved positive photoresist compositions obtained using the polyamide of this invention over those of prior art.

Photoresist compositions were prepared using the polyamides (polyoxazole precursors) of the present invention prepared substantially in accordance with Example 1 of the instant application and a poly(benzidine isophthalamide) which was prepared substantially in accordance with Example 1 of U.S. Pat. No. 4,339,521.

The photosensitivity (speed) of each resist composition was evaluated using the following general procedure. Bake time, spinspeed and other experimental conditions and results for each experiment are reported below.

The photoresist is spin-coated on several silicon wafers at a constant, predetermined spin speed ranging from 500 to 1500 rpm. The wafers are then baked at 90° C. for 30–45 minutes to remove the solvent. The initial film thicknesses of coated resist are measured by a Rudolf film Thickness Monitor. Photosensitivity is measured by generating a contrast curve as described (C.G. Willson in "Introduction to Microlithography," Chapter 3, p. 105, American Chemical Society, Washington, D.C. 1983). One plots film thickness loss after one minute development versus the logarithm (ln) of the UV exposure dose. Film thickness is monitored by laser interferometry using the technique described. The resist was then developed using alkaline aqueous developer (AZ Developer, available from American Hoechst Corporation, Somerville, N.J.) diluted with deionized water, at 25.0±0.5° C. By extrapolation of the plot to total film thickness loss, one obtains the photosensitivity value (mJ/cm$^2$).

The following photosensitizers were used in these experiments and are identified using the following abbreviations:
(a) Z-2000—a trihydroxybenzophenone - 1,2-naphthoquinone diazido-5-sulfonic acid mixed ester.
(b) TOOL—1,2-naphthoquinone-diazido-5-sulfonic acid tris ester of trihydroxy octanophenone.
(c) The sensitizer of Example 1 of U.S. Pat. No. 4,339,521—bis-naphthoquinone-(1,2)-(2)-5 sulfonic acid ester of 2,2-bis-(4-hydroxyphenyl)-propane, hereinafter '521 sensitizer.

EXAMPLE 5

A photoresist solution was prepared by dissolving 15 parts of the polyamide of Example 1 of this application and 15 parts of TOOL sensitizer in 70 parts of a mixed solvent consisting of equal parts by weight of propylene glycol methyl ether and N-methylpyrrolidone. The wafer was spincoated with the resulting solution, dried and exposed to a mercury lamp of 200 watts having wavelength of 365 nm as explained above. The developer concentration was 1 part AZ Developer to 2 parts water. The resist was evaluated using the procedure set forth above and the results were:

Photosensitivity—.76.4 mJ/cm$^2$
Erosion Rate—.0.007 um/min
The characteristic curve was normal and resist adhesion to the wafer was excellent.

EXAMPLE 6

A photoresist solution was prepared using 16 parts of the polyamide of Example 1 of this application, 8 parts TOOL sensitizer and 76 parts of a 50/50 mixture of N-methylpyrroli-done and propylene glycol methyl ether. The procedure of Example 5 was repeated and the resist developed in a 1:8, AZ Developer:water solution.
The results were:
Photosensitivity—.74.8 mJ/cm$^2$
Erosion Rate—.0.019 um/min
The characteristic curve was normal and resist adhesion to the wafer was excellent.

EXAMPLE 7

A polyamide was prepared substantially in accordance with the procedure of Example 1 of the present invention except 30 mole percent of the hexafluoro-2,2-bis(3-amino-4-hydroxyphenyl)-propane monomer was replaced with an equal molar quantity of hexafluoro-2,2-bis(3-amino-4-methylphenyl)-propane. The resulting polyamide was used in the resist formulation of Example 5. The resist was evaluated as in Example 5 except 1:6 AZ Developer:water solution was used.
The results of the evaluation were:
Photosensitivity—.65 mJ/cm$^2$
Erosion Rate—.0.016 um/min
The characteristic curve was normal and resist adhesion to the wafer was excellent.

EXAMPLE 8

The polyamide of Example 7 was evaluated as a photoresist using the same procedure as previously outlined. The resist composition was prepared by dissolving 20 parts of the polyamide of Example 7 and 10 parts of TOOL sensitizer in 70 parts of a 50/50 mixture of propylene glycol methyl ether and N-methylpyrrolidone. The developer solution was 1 part AZ Developer to 2 parts water. The result was as follows:
Photosensitivity—.81 mJ/cm$^2$
Erosion Rate—.0.007 um/mim

EXAMPLE 9

The polyamide of Example 4 evaluated as a photoresist using the procedure of Example 5. The photoresist composition was 13 parts of the acylated polyamide of Example 4 and 13 parts of TOOL sensitizer dissolved in 74 parts of mixed solvent consisting of equal amounts of N-methylpyrrolidone and propylene glycol methyl ether. The developer concentration was 1 part of AZ Developer to 2 parts water. The results were as follows:
Photosensitivity—.77.6 mJ/cm$^2$
Erosion Rate—.0.011 um/min
The characteristic curve was normal and adhesion of the resist to the wafer was excellent.

EXAMPLE 10

A polyamide was prepared substantially in accordance with the procedure of Example 1 except 30% (molar) of the diamino monomer of Example 1 was replaced with dianisidine as a comonomer and 100% terephthaloyl chloride as the acid chloride.
The photoresist properties were determined using the same procedure as Example 5. The photoresist composition was 15 parts of the polyamide compolymer, 15 parts of TOOL photosensitizer and 70 parts of equal amounts of N-methylpyrrolidone and propylene glycol methyl ether. The developer concentration was 1 part AZ Developer to 2 parts water.
Photosensitivity—.199.5 mJ/cm$^2$
Erosion Rate—.0.013 um/min

EXAMPLE 11

A polyamide was prepared substantially in accordance with the procedure of Example 1 except that 20% (molar) of the diamino monomer of Example 1 was replaced with an equal molar quantity of hexafluoro-2,2-bis (3-amino-4-methylphenyl)-propane and 100% terephthaloyl chloride was used as the dibasic acid chloride.
The resulting polyamide was used to make a photoresist composition by dissolving 15 parts of the polyamide and 15 parts of Z2000 sensitizer in 70 parts of N-methylpyrrolidone. The test wafers were processed according to the same procedure as used in the previous Examples. The developer solution was 1 part AZ Developer to 2 parts water. The results were:
Photosensitivity—.237.9
Erosion Rate—.0.008 um/min

COMPARATIVE EXAMPLE 12

The procedure of Example 5 was repeated using 8.5 parts of poly (dihydroxybenzidine isophthalamide) prepared in accordance with Example 1 of U.S. Pat. No. 4,339,521, 8.5 parts of TOOL sensitizer and 83 parts of N-methylpyrrolidone and a coating speed of 500 RPM. The developer solution was AZ Developer at a 1:5 dilution ratio. The results of this experiment were:
Photosensitivity—.589 mJ/cm$^2$
Erosion Rate—.0.015 um/min

COMPARATIVE EXAMPLE 13

Example 12 was repeated except 6.8 parts of poly (dihydroxybenzidine isophthalamide), 6.8 parts of the '521 sensitizer and 84.4 parts of N-methylpyrrolidone were used. The developer solution was concentrated AZ Developer. The results of this experiment were:
Photosensitivity—.364 mJ/cm$^2$
Erosion Rate—.0.007 um/min
The following Table 2 summarizes the results of these experiments:

TABLE 2

| PHOTOSPEED EVALUATION | | |
|---|---|---|
| EXAMPLE | | PHOTOSENSITIVITY mJ/cm$^2$ |
| 5 | | 76.4 |
| 6 | | 74.8 |
| 7 | | 65.0 |
| 8 | THIS | 81.0 |
| 9 | INVENTION | 77.6 |
| 10 | | 199.5 |
| 11 | | 237.9 |
| 12 | PRIOR ART | 589 |
| 13 | | 364 |

A series of additional experiments were conducted to show the improved properties of the polyamides of this invention using a lithographic technique. The polyamide to sensitizer ratio was varied in these experiments.
The following general procedure was used in this evaluation. The polyamide and photosensitizer were dissolved in solvent and roller coated on an anodized aluminum plate. The solvent was removed by drying at approximately 90° C. to produce a resist film of 2-3 um thick. The film was covered with a GATF Sensitivity Guide photomask consisting of a continuous-tone gray scale with 21 numbered step densities. The Sensitivity Guide was produced in accordance with the specifications in GATF Research Bulletin 215. The increase in density per step is 0.15.

The coated plated was exposed to UV radiation through the Sensitivity Guide, developed in alkaline aqueous developer and scale readings from the Sensitivity Guide developed image were read. Exposed time, developer concentration, development time, and polyamide to sensitizer ratio are noted below.

The following polyamides were prepared using the procedure of Example 1.

EXAMPLE 14

The condensation product of hexafluoro-2,2-bis(3-amino-4-hydroxyphenyl)-propane and terephthaloyl chloride.

EXAMPLE 15

The condensation product of hexafluoro-2,2-bis(3-amino-4-hydroxyphenyl)-propane and isophthaloyl chloride.

EXAMPLE 16

The condensation product of hexafluoro-2,2-bis(3-amino-4-hydroxyphenyl)-propane with hexafluoro-2,2-bis(4-chlorocarbonyl -phenyl)-propane.

EXAMPLE 17

The condensation product of hexafluoro-2,2-bis(3-amino-4-hydroxyphenyl)-propane and a 50/50 (molar) mixture of the hexafluoro-2,2-bis(4-chlorocarbonyl-phenyl)-propane and isophthaloyl chloride.

The polyamides of Example 1, 14, 15, 16 and 17 were prepared into photoresist coating compositions. The solvent was a 60/30 weight percent mixture of methylethyl ketone and propylene glycol methyl ether. The photosensitizer was Z-2000 and the developer (AZ Developer) was diluted with one part water. The development time was held constant at 90 seconds as was the UV expose time—90 seconds at 365 nm. The total solids content (polyamide plus sensitizer) was 10 weight percent in each case. The following Table 3 summarizes the results of these tests.

TABLE 3

| Polyamide | Polyamide/Sensitizer Ratio | Sensitivity Guide Reading | Photospeed Remarks |
| --- | --- | --- | --- |
| Example 1 | 1:1 | 7 | good |
|  | 6:1 | 21 | fast |
| Example 14 | 1:1 | 4 | slow |
|  | 6:1 | 21 | fast |
| Example 15 | 1:1 | 21 | fast |
|  | 6:1 | 21 | fast |
| Example 16 | 1:1 | 2 | slow |
|  | 6:1 | 6 | good |
| Example 17 | 1:1 | 7 | good |
|  | 6:1 | 21 | fast |

The above listed data shows that the polyamide/sensitizer ratio can be varied to control the resist's photospeed. The photospeed of the resist composition based on the polyamide of Example 16 was extremely high. In addition, the resist composition based upon the polyamide of Example 18 gave the best resolution and adhesion of the test group.

EXAMPLE 18

The polyamide of Example 16 was used to prepare a photo-resist coating composition by dissolving the polyamide in a 10/90 weight percent mixture of methylethyl ketone and propylene glycol methyl ether. The same procedure as reported above (Sensitivity Guide/coated aluminum plate) was used except the exposure time was 120 second and the alkaline aqueous developer was used without dilution with water. The results were as follows:

| Polyamide: Sensitizer Ratio | Sensitivity |
| --- | --- |
| 1:1 | 3 |
| 2:1 | 5 |
| 3:1 | 6 |
| 4:1 | 6 |
| 5:1 | 7 |
| 6:1 | 7 |

The adhesion of the resist coating to the aluminum plate was very high indicating that the polyamide would make an excellent protective coating in other than the photoresist area.

We claim:

1. A solvent soluble polyamide having recurring units of the class consisting of:

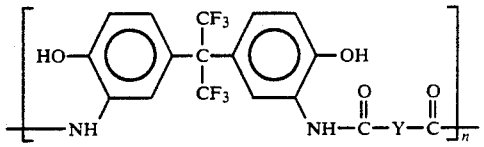

wherein
Y is:

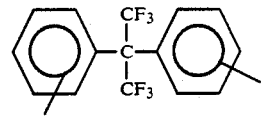

and
n is an integer of from 2 to 500.

2. The polyamide of claim 1 wherein Y is

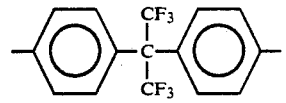

3. The polyamide of claim 1 wherein n is about 200.
4. The polyamide of claim 2 consisting of said recurring units.
5. The polyamide of claim 1 wherein said solvent comprises propylene glycol methyl ether.
6. The polyamide of claim 1 wherein said solvent comprises methyl ethyl ketone.

* * * * *